(12) United States Patent
Nishida et al.

(10) Patent No.: US 7,602,830 B2
(45) Date of Patent: Oct. 13, 2009

(54) MONOLITHIC SEMICONDUCTOR LASER AND METHOD OF MANUFACTURING THE SAME

(75) Inventors: Takehiro Nishida, Tokyo (JP); Motoharu Miyashita, Tokyo (JP); Tsutomu Yamaguchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/878,027

(22) Filed: Jul. 20, 2007

(65) Prior Publication Data

US 2007/0264738 A1 Nov. 15, 2007

Related U.S. Application Data

(62) Division of application No. 10/898,196, filed on Jul. 26, 2004.

(30) Foreign Application Priority Data

Sep. 30, 2003 (JP) .............................. 2003-339768

(51) Int. Cl.
*H01S 5/00* (2006.01)
(52) U.S. Cl. .............................. 372/50.12; 372/50.121; 438/35; 438/39; 438/42; 438/46; 438/47
(58) Field of Classification Search ............. 372/50.12, 372/50.121; 438/35, 39, 42, 46, 47
See application file for complete search history.

(56) References Cited

U.S. PATENT DOCUMENTS

| | | | |
|---|---|---|---|
| 4,890,293 A | | 12/1989 | Taneya et al. |
| 5,022,036 A | * | 6/1991 | Suyama et al. ............ 372/45.01 |
| 5,500,868 A | * | 3/1996 | Kurihara ................. 372/46.015 |
| 5,536,085 A | * | 7/1996 | Li et al. .................... 372/50.12 |
| 5,982,799 A | * | 11/1999 | Bour et al. .............. 372/50.121 |
| 6,256,330 B1 | * | 7/2001 | LaComb ................... 372/46.01 |
| 6,590,919 B1 | | 7/2003 | Ueta |
| 6,618,420 B1 | | 9/2003 | Gen-Ei et al. |
| 6,646,975 B1 | | 11/2003 | Uchizaki et al. |
| 6,680,958 B1 | * | 1/2004 | Nemoto .................... 372/43.01 |
| 7,079,474 B2 | | 7/2006 | Takahashi |

(Continued)

FOREIGN PATENT DOCUMENTS

EP 1 083 641 A1 3/2001

(Continued)

OTHER PUBLICATIONS

English machine translation of JP 2003-31904, cited by Applicants in the Jul. 20, 2007 IDS.*

(Continued)

*Primary Examiner*—Wael Fahmy
*Assistant Examiner*—Hrayr A Sayadian
(74) *Attorney, Agent, or Firm*—McDermott Will & Emery LLP

(57) ABSTRACT

A monolithic semiconductor laser having plural semiconductor lasers having different emission wavelengths from each other, including: a semiconductor substrate; a first double hetero-structure formed within a first area on the semiconductor substrate and having first clad layers disposed above and below a first active layer; and a second double hetero-structure formed within a second area on the semiconductor substrate and having second clad layers disposed above and below a second active layer. The first and second active layers are made of different semiconductor materials from each other. The first clad layers above and below the first active layer are of approximately the same semiconductor materials and the second clad layers above and below the second active layer are of approximately the same semiconductor materials.

9 Claims, 7 Drawing Sheets

U.S. PATENT DOCUMENTS

| | | | |
|---|---|---|---|
| 2001/0014109 A1* | 8/2001 | Hamamoto | 372/46 |
| 2001/0017873 A1 | 8/2001 | Imagujui et al. | |
| 2002/0024984 A1* | 2/2002 | Ohkubo et al. | 372/46 |
| 2002/0097662 A1 | 7/2002 | Fujii | |
| 2002/0187577 A1 | 12/2002 | Sakata et al. | |
| 2003/0058909 A1* | 3/2003 | Benyon | 372/43 |
| 2003/0091085 A1 | 5/2003 | Northrup et al. | |
| 2004/0062285 A1* | 4/2004 | Uchizaki et al. | 372/50 |

FOREIGN PATENT DOCUMENTS

| | | |
|---|---|---|
| EP | 1 137 134 A2 | 9/2001 |
| EP | 1 182 751 | 2/2002 |
| EP | 1 182 751 A2 | 2/2002 |
| JP | 2000-11417 A | 1/2000 |
| JP | 2001-077457 A | 3/2001 |
| JP | 2002-223030 | 8/2002 |
| JP | 2003-31904 | 1/2003 |

OTHER PUBLICATIONS

Nemoto, Kazuhiko et al., "A Laser Coupler for DVD/CD Playback Using a Monolithic-Integrated Two-Wavelength Laser Diode", JSPA International No. 3, Jan. 2001, pp. 9-14.

United States Office Action issued in U.S. Appl. No. 10/898,196, mailed Feb. 10, 2009.

European Office Action issued in European Patent Application No. 07 002825.3-2222 dated on May 7, 2008.

United States Office Action issued in U.S. Appl. No. 10/898,196, mailed Aug. 5, 2009.

* cited by examiner

MONOLITHIC SEMICONDUCTOR LASER AND METHOD OF MANUFACTURING THE SAME

This application is a Divisional of U.S. application Ser. No. 10/898,196, filed Jul. 26, 2004, claiming priority of Japanese Application No. 2003-339768, filed Sep. 20, 2003, the entire contents of each of which are hereby incorporated by reference.

CROSS-REFERENCE TO RELATED APPLICATION

Related patent application is commonly assigned Japanese Patent Application No. 2003-339768 filed on Sep. 30, 2003, which is incorporated by reference into the present patent application.

BACKGROUND OF THE INVENTION

1. Field of the Invention

The present invention relates to a monolithic semiconductor laser and a method of manufacturing the same, and more particularly, to a monolithic semiconductor laser comprising a stripe structure (current confining structure) and a method of manufacturing the same.

2. Description of the Related Art

An information reader/writer apparatus or the like for DVDs and CDs uses a monolithic semiconductor laser in which the single substrate seats multiple of semiconductor lasers which have different emission wavelengths. In such a monolithic semiconductor laser, the single substrate seats a semiconductor laser whose emission wavelength is 650 nm and a semiconductor laser whose emission wavelength is 780 nm, for example.

After one of the semiconductor lasers is formed on the substrate, the location of the other one of the semiconductor lasers is determined using alignment marks which are provided on the substrate, to thereby fabricate the monolithic semiconductor laser (K. Nemoto and K. Miura: "A Laser Coupler for DVD/CD Playback Using a Monolithic-integrated Two-wavelength Laser Diode," JSAP International, No. 3, pp. 9-14 (January 2001)).

SUMMARY OF THE INVENTION

In an information reader/writer apparatus or the like for DVDs and CDs, a monolithic semiconductor laser and other components such as a lens are assembled together and an optical system is accordingly obtained.

However, in a monolithic semiconductor laser fabricated in accordance with a conventional manufacturing method, the distance between emission points of two semiconductor lasers is dependent upon the accuracy of aligning locations as described above. Between different production batches therefore, the distance between the emission points, namely relative locations of stripe structures, is different and it is therefore necessary to finely adjust the locations of the lens, etc.

The fine adjustment makes the assembling step complex and increases a manufacturing cost.

An object of the present invention is to provide a monolithic semiconductor laser in which relative locations of stripe structures, namely the distance between emission points, remain constant and a method of manufacturing the same.

The present invention is directed to a monolithic semiconductor laser having plural semiconductor lasers having different emission wavelengths from each other, including: a semiconductor substrate; a first double hetero-structure formed within a first area on the semiconductor substrate and having first clad layers disposed above and below a first active layer; and a second double hetero-structure formed within a second area on the semiconductor substrate and having second clad layers disposed above and below a second active layer. The first and second active layers are made of different semiconductor materials from each other. The first clad layers above and below the first active layer are of approximately the same semiconductor materials and the second clad layers above and below the second active layer are of approximately the same semiconductor materials.

In the monolithic semiconductor laser according to the present invention, the gap between stripe structures (current confining structures) of plural semiconductor lasers, i.e., the distance between emission points is always approximately constant.

"The same materials" herein referred to are semiconductor materials which are the same in terms of material and/or composition. "Different materials" herein referred to are semiconductor materials which are different in terms of material and/or composition.

In another aspect of the present invention, a method of manufacturing a monolithic semiconductor laser having plural semiconductor lasers having different emission wavelengths is provided comprising preparing a semiconductor substrate, stacking within a first area on the semiconductor substrate a first semiconductor layer including a first double hetero-structure in which an active layer is disposed between an upper and a lower clad layers, and stacking within a second area on the semiconductor substrate a second semiconductor layer including a second double hetero-structure in which an active layer is disposed between an upper and a lower clad layers. An etching-resistant pattern film is formed on the first double hetero-structure which is formed within the first area and the second double hetero-structure which is formed within the second area. A plurality of first stripes in an upper surface of the first double hetero-structure and a plurality of second stripes in an upper surface of the second double hetero-structure are simultaneously formed using the pattern film. The first stripes are defined by a plurality of first trenches formed adjacent the first stripes and the second stripes are defined by a plurality of second trenches formed adjacent the second stripes. The second trenches are formed to a greater depth than a depth of the first trenches.

DETAILED DESCRIPTION OF THE PREFERRED EMBODIMENTS

Embodiment 1

FIGS. 1A-1G are cross sectional views of steps of manufacturing a monolithic semiconductor laser according to this embodiment which is generally denoted at 100. The monolithic semiconductor laser 100 has a first semiconductor laser whose emission wavelength is 780 nm and a second semiconductor laser whose emission wavelength is 650 nm (See FIG. 1G).

The steps of manufacturing the monolithic semiconductor laser 100 will now be described with reference to FIGS. 1A-1G. These steps include the following steps 1 through 7.

Figure 1A:
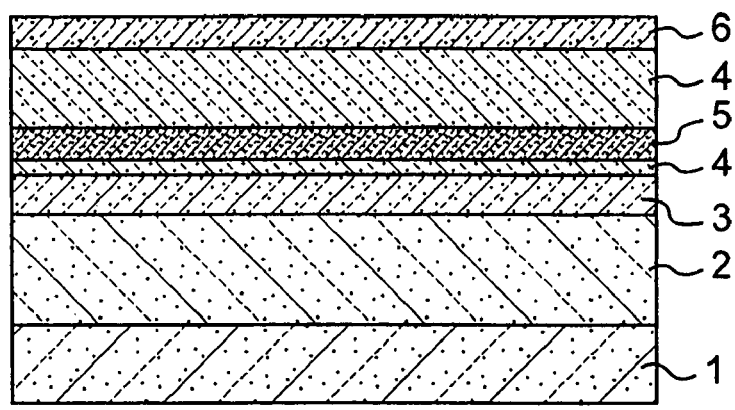
FIGS. 1A-1G show cross sectional views of the steps of manufacturing the monolithic semiconductor laser according to the embodiment 1 of the present invention.

Step 1: As shown in FIG. 1A, a GaAs substrate 1 of the n-type is prepared. On the GaAs substrate 1, an n-AlGaInP lower clad layer 2, an AlGaAs active layer (having the emission wavelength of 780 nm) 3 and a p-AlGaInP upper clad layer 4 are then stacked one atop the other. A GaInP etching stopper layer 5 is inserted in the p-AlGaInP upper clad layer 4. Further, on the p-AlGaInP upper clad layer 4, a p-GaAs cap layer 6 is formed.

The AlGaAs active layer 3 has such a composition which provides the emission wavelength of 780 nm.

The respective semiconductor layers 2 through 6 are formed using an MOCVD method for instance.

Figure 1B:
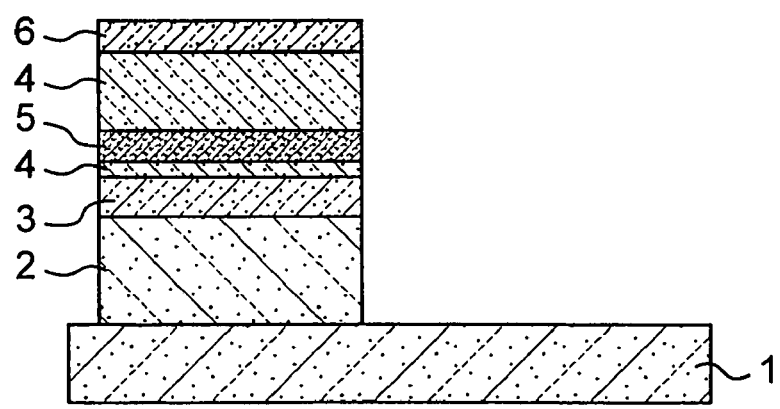

Step 2: As shown in FIG. 1B, by means of a photolithographic technique and an etching technique, thus formed semiconductor layers 2 through 6 are removed except for within the area where the first semiconductor laser is to be formed.

Figure 1C:
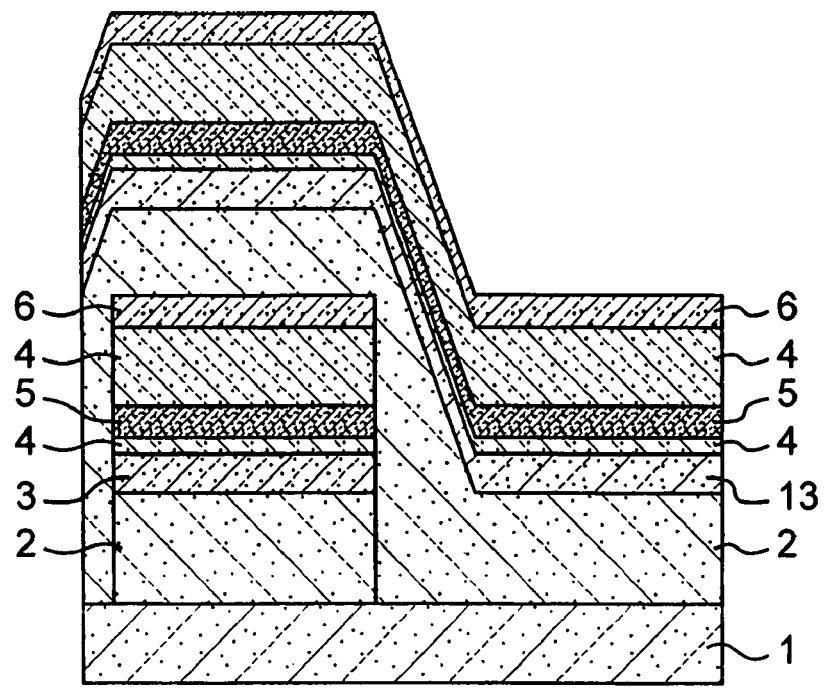

Step 3: As shown in FIG. 1C, by an MOCVD method for instance, semiconductor layers for forming the second semiconductor laser are stacked one atop the other. These semiconductor layers have the same compositions, the same impurity concentrations and the same film thicknesses as those of the semiconductor layers which are used to form the first semiconductor laser, with an exception of an AlGaInP active layer 13. The AlGaInP active layer 13 has such a composition which provides the emission wavelength of 650 nm.

Figure 1D:
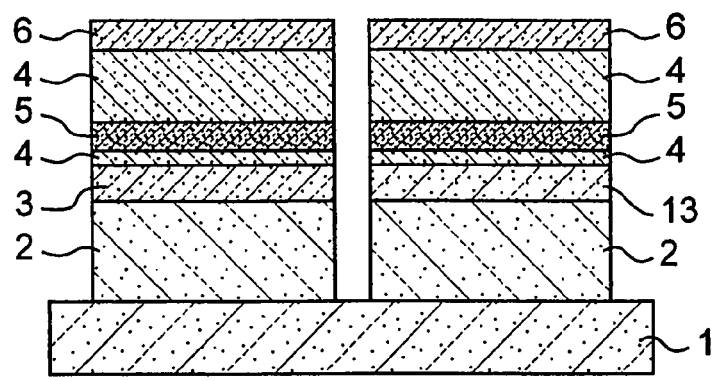

Step 4: As shown in FIG. 1D, by means of a photolithographic technique and an etching technique, thus formed semiconductor layers 2 through 6 are removed except for within the area where the second semiconductor laser is to be formed, which is similar to the step 2 (FIG. 1B). This results in a stacked structure as that shown in FIG. 1D.

Figure 1E:
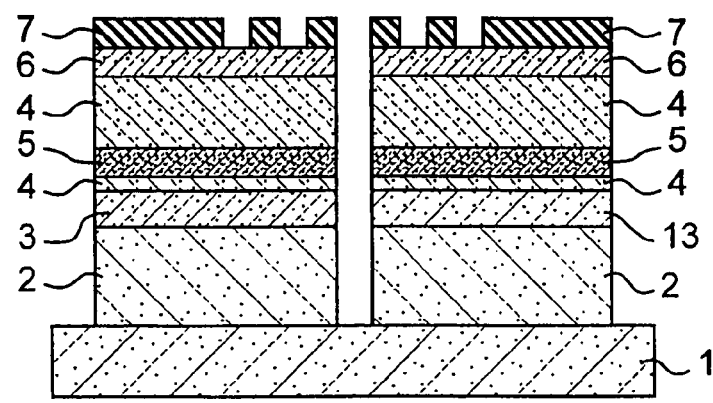

Step 5: As shown in FIG. 1E, photoresist layers 7 are formed and patterned on the semiconductor layers which are used as the first semiconductor laser and the second semiconductor laser. At this step, the photoresist layers 7 on the both sets of semiconductor layers are patterned simultaneously using a common photomask.

Instead of the photoresist layers 7, other patterned films which are resistant against etching may be used.

Figure 1F:
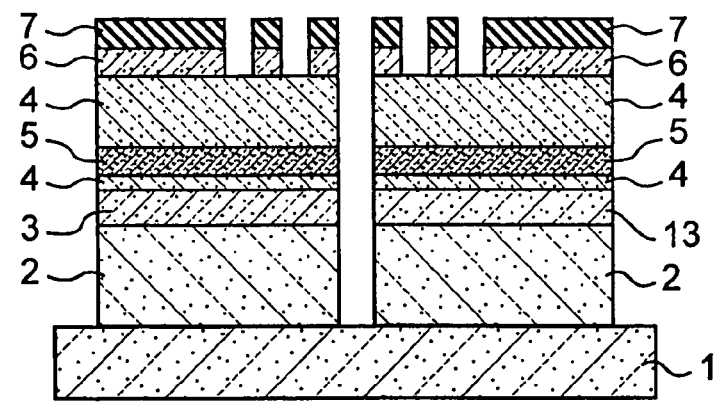

Step 6: As shown in FIG. 1F, the p-GaAs cap layer 6 is removed through wet etching which uses a solution which is obtained by mixing a tartaric acid and hydrogen peroxide. A wet etchant using a solution of a tartaric acid allows an improvement of etching selectivity between As-containing semiconductors and P-containing semiconductors. Because of this, the etching almost stops upon arrival at the P-containing semiconductor surface (which is the p-AlGaInP upper clad layer 4).

Figure 1G:
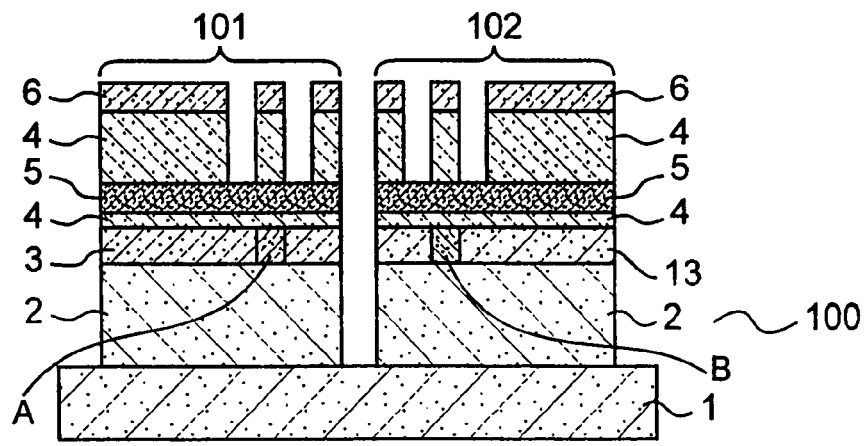

Step 7: As shown in FIG. 1G, using an etchant containing a sulfuric acid, the p-AlGaInP upper clad layer 4 is etched until the GaInP etching stopper layer 5 gets exposed.

Use of a sulfuric acid-based etchant increases etching selectivity between the AlGaInP layer (the upper clad layer), the GaInP (the etching stopper layer) and the GaAs layer (the cap layer). Hence, as the p-AlGaInP upper clad layer 4 is etched using the p-GaAs cap layer 6 as a mask, the etching approximately stops when the GaInP etching stopper layer 5 gets exposed.

Insertion of the GaInP etching stopper layer 5 thus controls the shapes of ridge-type stripes in the depth direction.

Through the steps 1 to 7 described above, the monolithic semiconductor laser 100 is fabricated which includes the first semiconductor laser 101 and the second semiconductor laser 102 which have different emission wavelengths.

Metal electrodes are formed on the back surface of the GaAs substrate 1 and the front surface of the p-GaAs cap layer 6, which will not be described here.

When the manufacturing method according to the embodiment is used, ridge structures for the two semiconductor lasers 101 and 102 having ridge-type stripe structures are fabricated at the same time. This ensures that the relative distance between the emission points A and B at which the 650/780 nm lasers are emitted always remains constant. Even if the location of the photomask gets deviated at the step 5, the relative distance stays unchanged while the locations of the emission points A and B are displaced.

In general, the location of an optical system containing a lens and the like is finely adjusted depending upon the locations of emission points within an optical apparatus which incorporates a monolithic semiconductor laser.

However, in the monolithic semiconductor laser 100 which is fabricated in accordance with the manufacturing method according to the embodiment, since the relative distance between the two emission points remains constant, such fine adjustment of the optical system is not necessary.

It is to be noted in particular that the first semiconductor laser and the second semiconductor laser are etched concurrently, which lessens the manufacturing steps.

Figure 1H:
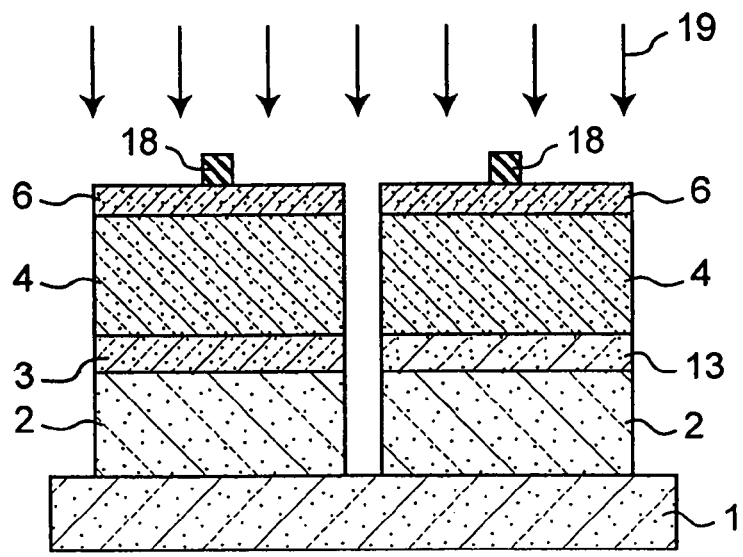
FIGS. 1H and 1I show cross sectional views of the steps of manufacturing other monolithic semiconductor laser according to the embodiment 1 of the present invention.
Figure 1I:
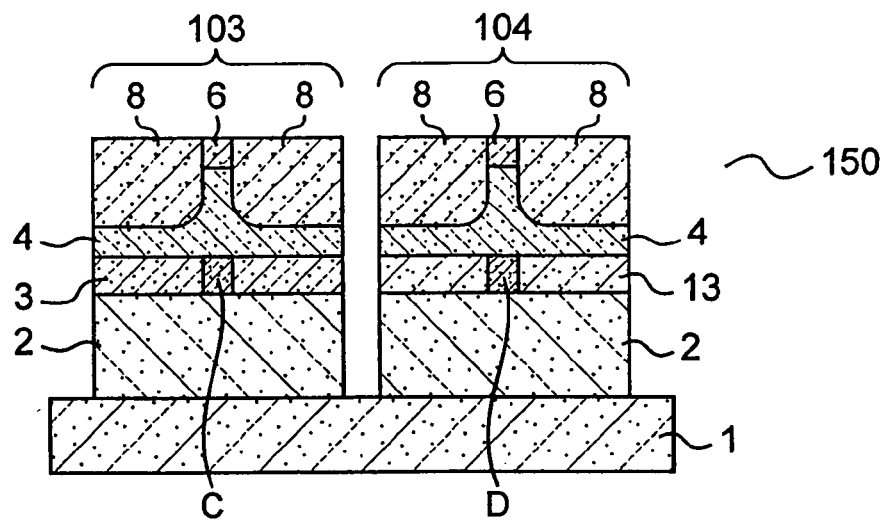

FIGS. 1H and 1I show cross sectional views of steps of manufacturing other monolithic semiconductor laser 150 according to the embodiment. In FIGS. 1H and 1I, the same reference symbols as those in FIGS. 1A-1G denote the same or corresponding portions.

In accordance with this manufacturing method, the respective semiconductor layers are formed following the steps 1 through 4 described above (FIGS. 1A-1D). However, the GaInP etching stopper layer 5 is not formed.

After a resist mask 18 is formed, protons 19 are then implanted by an ion implantation method as shown in FIG. 1H.

As a result, as shown in FIG. 1I, the resistance values become high in parts of the p-AlGaInP upper clad layer 4 and the p-GaAs cap layer 6, thereby forming high-resistance layers 8. Metal electrodes (not shown) are formed on the front and the back surfaces after removal of the resist mask 18, and the monolithic semiconductor laser 150 is thus completed.

In the monolithic semiconductor laser 150 as well, the relative distance between the stripe structures of two semiconductor lasers 103 and 104, i.e., the relative distance between emission points C and D is constant.

Further, at one step, the high-resistance layers are formed at the same time for the first and the second semiconductor lasers.

Although this embodiment requires that the lower clad layers and the upper clad layers of the first and the second semiconductor lasers 101 and 102 are all made of the semiconductor material having the same material and the same composition, different semiconductor materials having different material and/or different compositions may be used between the first semiconductor laser 101 and the second semiconductor laser 102. This remains similar in the following embodiments.

To be more specific, the first semiconductor laser 101 has a structure in which the active layer 3 which is a mono-layer or multi-layer of $Al_{x1}Ga_{1-x1}As$ ($0 \leq x1 \leq 1$) is located between the lower and the upper clad layers 2 and 4 of $(Al_{x2}Ga_{1-x2})_{y2}In_{1-y2}P$ ($0 \leq x2 \leq 1$, $0 \leq y2 \leq 1$), while the second semiconductor laser 102 has a structure in which the active layer 13 which is a mono-layer or multi-layer of $(Al_{x3}Ga_{1-x3})_{y3}In_{1-y3}P$ ($0 \leq x3 \leq 1$, $0 \leq y3 \leq 1$) is located between the upper clad layers 2 and 4 of $(Al_{x2}Ga_{1-x2})_{y2}In_{1-y2}P$ ($0 \leq x2 \leq 1$, $0 \leq y2 \leq 1$). The lower and the upper clad layers of the first semiconductor laser 101 may be made of $(Al_{x2}Ga_{1-x2})_{y2}In_{1-y2}P$ ($0 \leq x2 \leq 1$, $0 \leq y2 \leq 1$) and the lower and the upper clad layers of the second semiconductor laser 102 may be made of $(Al_{4}Ga_{1-x4})_{y4}In_{1-y4}P$ ($0 \leq x4 \leq 1$, $0 \leq y4 \leq 1$) which is different from the material of the first semiconductor laser 101. This is the same in the following embodiments.

As the materials of the first and the second semiconductor lasers, an AlGaN-based material, a GaInNAs-based material or an AlGaInNAs-based material may be used in addition to an AlGaAs-based material and an AlGaInP-based material. As the materials of the active layers, an AlGaInAsP-based material or an AlGaInAs-based material may be used in addition to an AlGaAs-based material and an AlGaInP-based material. The active layers may be mono-layer or multi-layer. This is the same in the following embodiments.

Embodiment 2

Figure 2A:
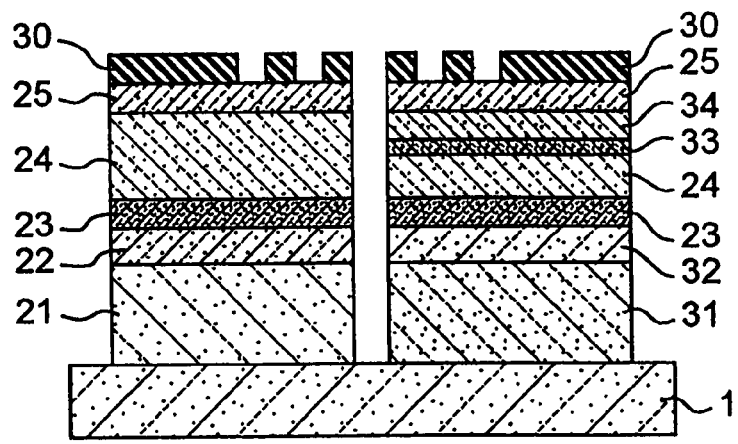
FIGS. 2A-2C show cross sectional views of the steps of manufacturing the monolithic semiconductor laser according to the embodiment 2 of the present invention.
Figure 2B:
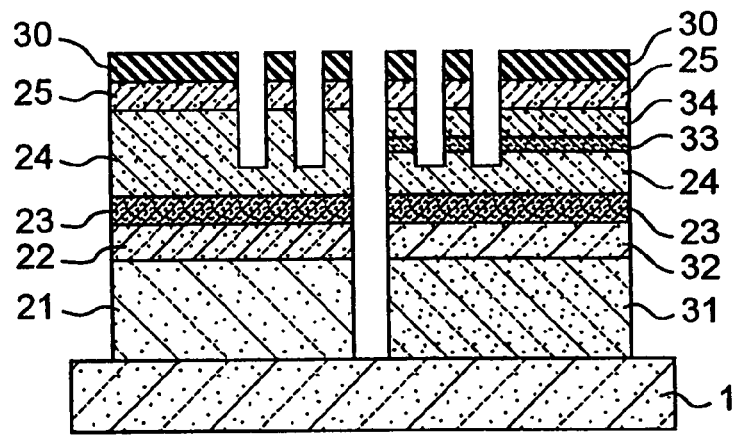
Figure 2C:
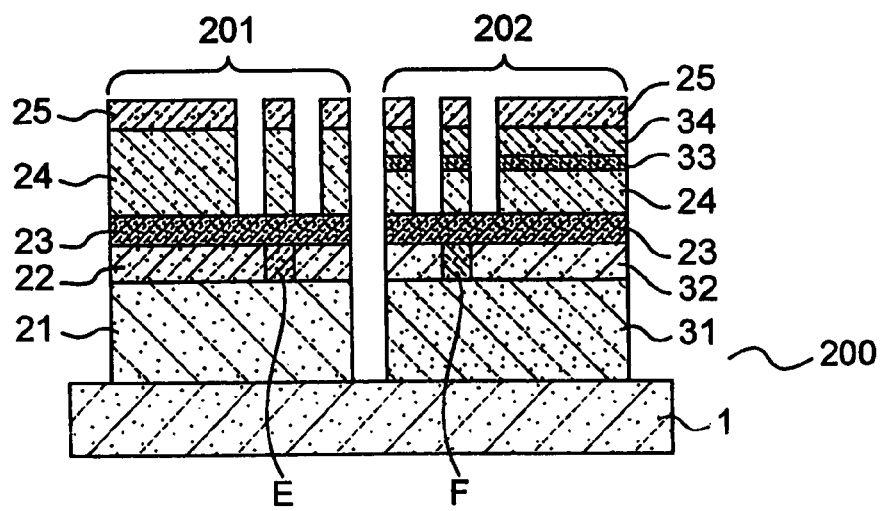

FIGS. 2A-2C show cross sectional views of steps of manufacturing a monolithic semiconductor laser according to this embodiment which is generally denoted at 200. The monolithic semiconductor laser 200 has two semiconductor lasers 201 and 202 which have different emission wavelengths (The emission wavelengths are 780 nm and 650 nm for example) (FIG. 2C).

In the monolithic semiconductor laser 200 according to the embodiment 2, the compositions and the like of other layers than active layers are different between the two semiconductor lasers 201 and 202. Use of stopper layers makes it possible to etch at a high accuracy also in these structures.

Through approximately the same steps (FIGS. 1A-1D) as those exercised in the embodiment 1 described above, a stacked structure as that shown in FIG. 2A is fabricated on an n-GaAs substrate 1.

As the first semiconductor laser, on the n-GaAs substrate 1, an n-AlGaInP lower clad layer 21, an AlGaAs active layer 22, a GaInP etching stopper layer 23, a p-AlGaInP upper clad layer (first upper clad layer) 24 and a p-GaAs cap layer 25 are stacked one atop the other.

Meanwhile, as the second semiconductor laser, on the n-GaAs substrate 1, an n-AlGaInP lower clad layer 31, an AlGaInP active layer 32, a GaInP etching stopper layer 23, a p-AlGaInP upper clad layer (second upper clad layer) 24, p-AlGaAs upper clad layers 33, 34, a p-GaAs cap layer 25 are stacked one atop the other. The layers denoted at different reference symbols (those denoted at 33 and 34 for instance) have different compositions. Further, the respective semiconductor layers are formed by an MOCVD method for example.

Following this, photoresist layers are formed and patterned on the semiconductor layers which are used as the first and the second semiconductor lasers 201 and 202, thereby forming a resist mask 30. At this step, the photoresist layers on the both sets of semiconductor layers are patterned simultaneously using a common photomask.

Using the resist mask 30 as an etching mask, the structures are thus etched halfway through into the p-AlGaInP upper clad layers 24.

In the first semiconductor laser 201 and the second semiconductor laser 202, as described above, the semiconductor layers above the etching stopper layers 23 have different compositions and different film thicknesses.

Nevertheless, when the manufacturing method according to this embodiment is used, even the semiconductor lasers different compositions are etched by such an etching method which realizes approximately equal etching speeds.

To be more specific, during ECR etching which uses a mixture gas of a chloride gas and an oxygen gas as an etching gas, the AlGaAs-based semiconductor lasers and the AlGaInP-based semiconductor lasers are etched at approximately equal etching speeds.

Through ECR etching for instance, the structures are etched halfway through into the p-AlGaInP upper clad layers 24 as shown in FIG. 2B.

After removal of the resist mask 30, the p-AlGaInP upper clad layers 24 are etched using a sulfuric acid-based etchant until the GaInP etching stopper layers 23 get exposed. In this case, the GaAs cap layers 25 serve as an etching mask.

As described above, during the etching using a sulfuric acid-based etchant, the etching almost stops when the GaInP etching stopper layers 23 get exposed.

Through these steps, ridge-type stripe structures as those shown in FIG. 2C are fabricated. Following this, metal electrodes (not shown) are formed on the front and the back surfaces, whereby the monolithic semiconductor laser 200 is completed.

In this monolithic semiconductor laser 200, the gap between the ridge-type stripes of the two semiconductor lasers 201 and 202, namely, the relative distance between emission points E and F is constant.

According to this embodiment, the first semiconductor laser 201 and the second semiconductor laser 202 include the GaInP etching stopper layers 23 and the upper clad layers 24 which are formed immediately on the GaInP etching stopper layers 23 and exhibit high etching selectivity against the GaInP etching stopper layers 23. Hence, it is possible to accurately control the etching of the semiconductor lasers above the GaInP etching stopper layers 23.

Meanwhile, since the semiconductor lasers below the GaInP etching stopper layers 23 are not etched, the compositions of them may be chosen without considering the etching step.

Alternatively, in the monolithic semiconductor laser 200, instead of forming the ridge-type stripes, high-resistance layers may be formed to obtain the stripe structures.

Embodiment 3

Figure 3A:
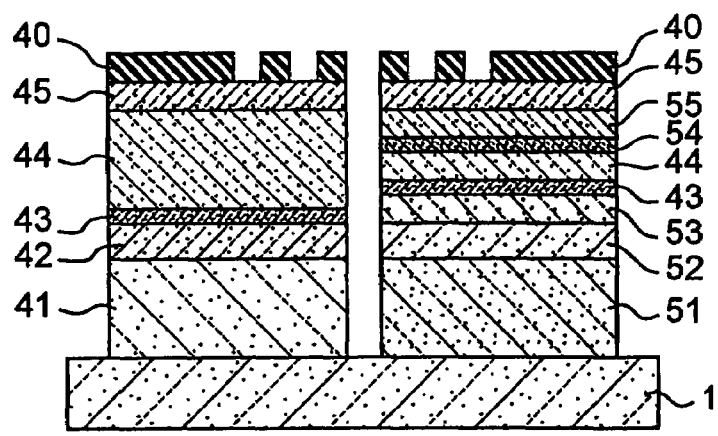
FIGS. 3A-3C show cross sectional views of the steps of manufacturing the monolithic semiconductor laser according to the embodiment 3 of the present invention.
Figure 3B:
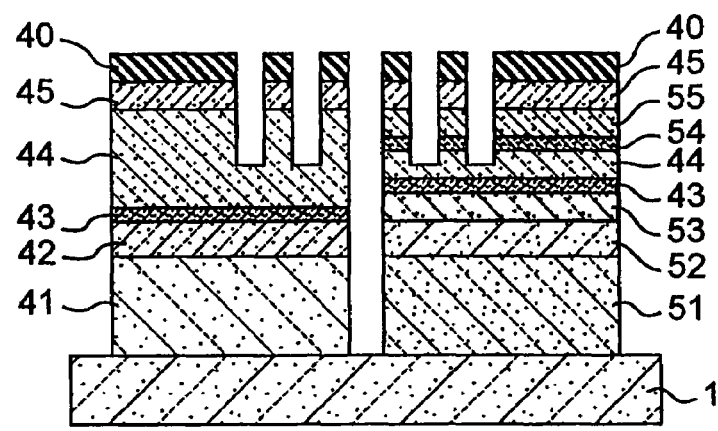
Figure 3C:
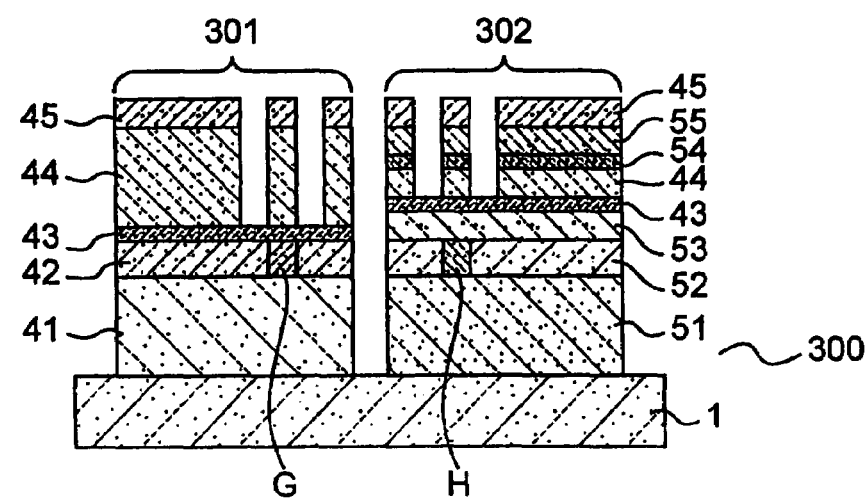

FIGS. 3A-3C show cross sectional views of steps of manufacturing a monolithic semiconductor laser according to this embodiment which is generally denoted at 300. The monolithic semiconductor laser 300 comprises two semiconductor lasers 301 and 302 which have different emission wavelengths (The emission wavelengths are 780 nm and 650 nm for example) (FIG. 3C).

In the monolithic semiconductor laser 300, ridge-type stripes are formed so that the ridge-type stripes have different depths between the two semiconductor lasers 301 and 302, and the refractive indices of the ridge-type stripes are adjusted.

In the monolithic semiconductor laser 300, first, through approximately the same steps (FIGS. 1A-1D) as those exercised in the embodiment 1 described earlier, a stacked structure as that shown in FIG. 3A is fabricated on an n-GaAs substrate 1.

As the first semiconductor laser, on the n-GaAs substrate 1, an n-AlGaInP lower clad layer 41, an AlGaAs active layer 42, a GaInP etching stopper layer 43, a p-AlGaInP upper clad layer (first upper clad layer) 44 and a p-GaAs cap layer 45 are stacked one atop the other.

On the other hand, as the second semiconductor laser, on the n-GaAs substrate 1, an n-AlGaInP lower clad layer 51, an AlGaInP active layer 52, an n-AlGaAs upper clad layer 53, a GaInP etching stopper layer 43, a p-AlGaInP upper clad layer (second upper clad layer) 44, p-AlGaAs upper clad layers 54, 55, a p-GaAs cap layer 45 are stacked one atop the other. The layers denoted at different reference symbols (those denoted at 54 and 55 for instance) have different compositions. Further, the respective semiconductor layers are formed by an MOCVD method for example.

Following this, photoresist layers are formed and patterned on the semiconductor layers which are used as the first and the second semiconductor lasers 301 and 302, thereby forming a resist mask 40. At this step, the photoresist layers on the both sets of semiconductor layers are patterned simultaneously using a common photomask.

Using the resist mask 40 as an etching mask, the structures are etched halfway through into the p-AlGaAs upper clad layers 44, as shown in FIG. 3B. This etching may be ECR etching which is used in the embodiment 2 described above.

As in the embodiment 2, the p-AlGaInP clad layers 44 are then etched using a sulfuric acid-based etchant until the GaInP etching stopper layers 43 get exposed after removal of the resist mask 40. In this case, the GaAs cap layers 45 serve as an etching mask. The etching almost stops when the GaInP etching stopper layers 43 get exposed.

Through these steps, ridge-type stripe structures as those shown in FIG. 3C are fabricated. Following this, metal electrodes (not shown) are formed on the front and the back surfaces, whereby the monolithic semiconductor laser 300 is completed.

In this fashion, when the manufacturing method according to this embodiment is used, the semiconductor lasers 301 and 302 in which the ridge-type stripes have different depths are fabricated on the same substrate in such a manner that the gaps between the ridges are maintained approximately constant.

Embodiment 4

Figure 4A:
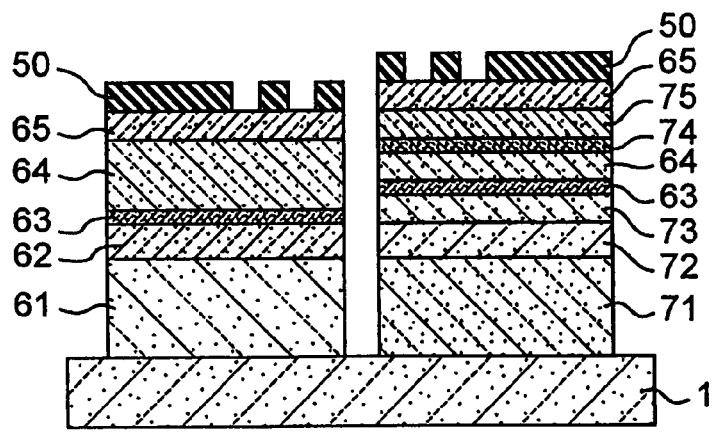
FIGS. 4A-4C show cross sectional views of the steps of manufacturing the monolithic semiconductor laser according to the embodiment 4 of the present invention.
Figure 4B:
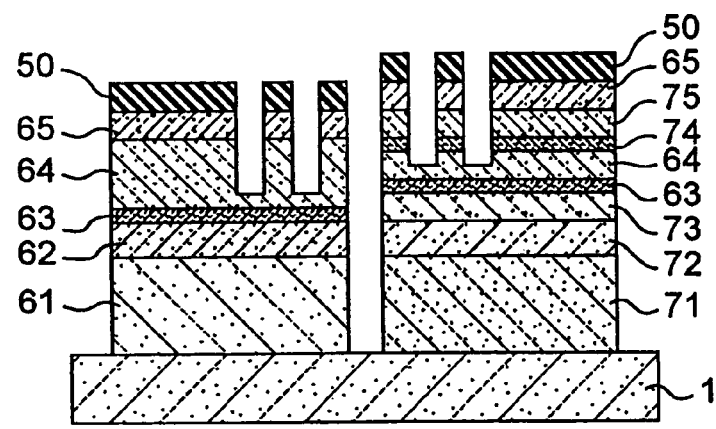
Figure 4C:
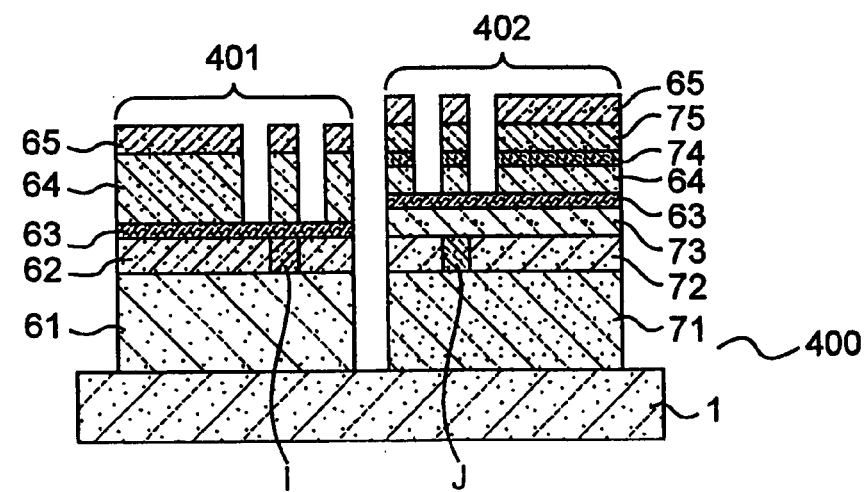
Figure 5:
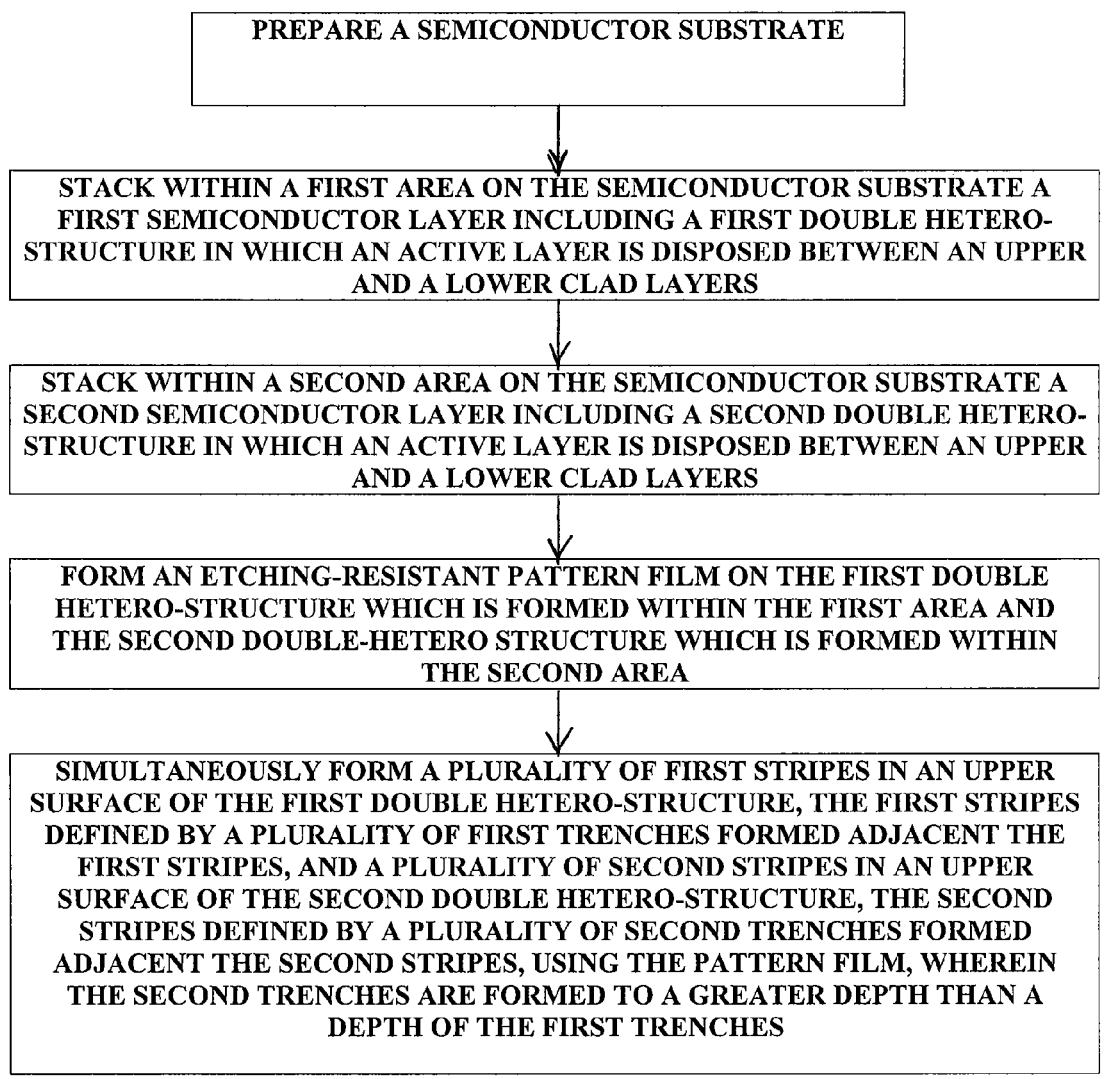
FIG. 5 shows a flowchart of a method of manufacturing a monolithic semiconductor laser according to the third embodiment of the present invention.

FIGS. 4A-4C show cross sectional views of steps of manufacturing a monolithic semiconductor laser according to this embodiment which is generally denoted at 400. The monolithic semiconductor laser 400 has two semiconductor lasers 401 and 402 which have different emission wavelengths (The emission wavelengths are 780 nm and 650 nm for example) (FIG. 4C).

In the monolithic semiconductor laser 400, the two semiconductor lasers 401 and 402 have different heights (namely, the heights from the surface of a GaAs substrate 1 up to the surfaces of GaAs cap layers 50).

In the monolithic semiconductor laser 400, first, through approximately the same steps (FIGS. 1A-1D) as those exercised in the embodiment 1 described earlier, a stacked structure as that shown in FIG. 4A is fabricated on the n-GaAs substrate 1.

As the first semiconductor laser 401, on the n-GaAs substrate 1, an n-AlGaInP lower clad layer 61, an AlGaAs active layer 62, a GaInP etching stopper layer 63, a p-AlGaInP upper clad layer (first upper clad layer) 64 and a p-GaAs cap layer 65 are stacked one atop the other.

On the other hand, as the second semiconductor laser 402, on the n-GaAs substrate 1, an n-AlGaInP lower clad layer 71, an AlGaInP active layer 72, an n-AlGaAs upper clad layer 73, a GaInP etching stopper layer 63, a p-AlGaInP upper clad layer (second upper clad layer) 64, p-AlGaAs upper clad layers 74, 75, a p-GaAs cap layer 65 are stacked one atop the other. The layers denoted at different reference symbols (those denoted at 54 and 55 for instance) have different compositions. Further, the respective semiconductor layers are formed by an MOCVD method for example.

As shown in FIG. 4A, according to this embodiment, the first semiconductor laser 401 and the second semiconductor laser 402 have different heights, and there is thus a stepped surface.

Following this, photoresist layers are formed and patterned on the semiconductor layers which are used as the first and the second semiconductor lasers 401 and 402, thereby forming a resist mask 50. At this step, the photoresist layers on the both sets of semiconductor layers are patterned simultaneously using a common photomask. In this manner, even when the first and the second semiconductor lasers have different heights and there is a surface which is stepped to a certain extent, the both photoresist layers are patterned simultaneously.

Using the resist mask 50 as an etching mask, the structures are etched halfway through into the p-AlGaAs upper clad layers 64, as shown in FIG. 4B. This etching may be ECR etching which is used in the embodiment 2 described earlier.

As in the embodiment 2, the p-AlGaInP clad layers 64 are then etched using a sulfuric acid-based etchant until the GaInP etching stopper layers 63 get exposed after removal of the resist mask 50. In this case, the GaAs cap layers 65 serve as an etching mask. The etching almost stops when the GaInP stopper layers 63 get exposed.

Through these steps, ridge-type stripe structures as those shown in FIG. 4C are fabricated. Following this, metal electrodes (not shown) are formed on the front and the back surfaces, whereby the monolithic semiconductor laser 400 is completed.

In this fashion, when the manufacturing method according to this embodiment is used, the semiconductor lasers 401 and 402 in which the ridge-type stripes have different heights are fabricated on the same substrate.

Alternatively, in the monolithic semiconductor laser 400, instead of forming the ridge-type stripes, high-resistance layers may be formed to obtain the stripe structures.

While the foregoing has described the embodiments 1 through 4 in relation to a monolithic semiconductor laser which comprises two semiconductor lasers, the present invention is applicable to a monolithic semiconductor laser which comprises three or more semiconductor lasers. In addition, although the foregoing has described such semiconductor lasers which have emission wavelengths of 780 nm and 650 nm, the present invention is applicable also to semiconductor lasers which have other emission wavelengths.

The invention claimed is:

1. A method of manufacturing a monolithic semiconductor laser having plural semiconductor lasers having different emission wavelengths, comprising:

preparing a semiconductor substrate;

stacking within a first area on the semiconductor substrate a first semiconductor layer including a first double hetero-structure in which an active layer is disposed between an upper and a lower clad layers;

stacking within a second area on the semiconductor substrate a second semiconductor layer including a second double hetero-structure in which an active layer is disposed between an upper and a lower clad layers;

forming an etching-resistant pattern film on the first double hetero-structure which is formed within the first area and the second double hetero-structure which is formed within the second area; and simultaneously forming a plurality of first stripes in the first double hetero-structure, the first stripes defined by a plurality of first trenches formed adjacent the first stripes, and a plurality of second stripes the second double hetero-structure, the second stripes defined by a plurality of second trenches formed adjacent the second stripes, using the pattern film, wherein the second trenches are formed to a greater depth than a depth of the first trenches.

2. The manufacturing method of claim 1, wherein forming the etching-resistant pattern film comprises simultaneously exposing resist layers formed on the first semiconductor layer and the second semiconductor layer using a photomask.

3. The manufacturing method of claim 1, further comprising forming etching stopper layers each in an upper portion of each one of the first double hetero-structure and the second double hetero-structure, wherein forming the stripes comprises simultaneously etching the first semiconductor layer and the second semiconductor layer using the pattern film as an etching mask and thereby exposing the etching stopper layers.

4. The manufacturing method of claim 3, wherein the etching comprises wet etching.

5. The manufacturing method of claim 1, further comprising wet etching after dry etching to thereby expose the etching stopper layers.

6. The manufacturing method of claim 1, wherein forming the stripes further comprises simultaneously implanting protons into the first semiconductor layer and the second semiconductor layer using the pattern film as an ion implantation mask and thereby forming high-resistance layers.

7. The manufacturing method of claim 3, wherein the etching stopper layer is formed immediately adjacent the active layer in the second double hetero-structure.

8. The manufacturing method of claim 3, further comprising a second upper clad layer in the first double hetero-structure immediately adjacent and in between the etching stopper layer and the active layer.

9. The manufacturing method of claim 1, wherein the first and second double hetero-structures are different from each other.

* * * * *